(12) United States Patent
Kazama et al.

(10) Patent No.: US 7,358,749 B2
(45) Date of Patent: Apr. 15, 2008

(54) METHOD, APPARATUS, AND PROGRAM FOR MEASURING AN ELECTROMAGNETIC FIELD AND MEDIUM STORING THE PROGRAM

(75) Inventors: Satoshi Kazama, Gunma (JP);
Masahiko Sakurada, Gunma (JP);
Hiroshi Tsutagaya, Gunma (JP)

(73) Assignee: Taiyo Yuden, Co., Ltd., Tokyo (JP)

( * ) Notice: Subject to any disclaimer, the term of this patent is extended or adjusted under 35 U.S.C. 154(b) by 157 days.

(21) Appl. No.: 11/336,494

(22) Filed: Jan. 20, 2006

(65) Prior Publication Data

US 2006/0220635 A1    Oct. 5, 2006

(30) Foreign Application Priority Data

Jan. 20, 2005  (JP)  ............. 2005-012338

(51) Int. Cl.
*G01R 31/302* (2006.01)
*G01R 31/02* (2006.01)
*G01R 33/00* (2006.01)

(52) U.S. Cl. .............. 324/750; 324/537; 324/260

(58) Field of Classification Search .......... 324/750, 324/260, 537
See application file for complete search history.

(56) References Cited

U.S. PATENT DOCUMENTS 3,715,660 A * 2/1973 Ruhnke .............. 324/72
4,806,851 A * 2/1989 Krider et al. .......... 324/72
4,829,238 A * 5/1989 Goulette et al. ....... 324/95

5,574,805 A * 11/1996 Toba et al. ............ 385/3
6,215,294 B1 * 4/2001 Coleman ............... 324/72
6,411,104 B1 * 6/2002 Uesaka et al. ......... 324/633

(Continued)

FOREIGN PATENT DOCUMENTS

JP  2004-69372  3/2004

OTHER PUBLICATIONS

Kazama. (Electromagnetic Compatibility, 2002 IEEE International Symposium on vol. 1, Aug. 19-23, 2002 pp. 395-400.*

(Continued)

*Primary Examiner*—Benny Q Tieu
*Assistant Examiner*—Karen M Kusumakar
(74) *Attorney, Agent, or Firm*—Knobbe Martens Olson & Bear LLP

(57) ABSTRACT

Provided is a method, apparatus and program for calculating an electric-field vector that allows for grasping the intensity, direction and phase of electric field on a scanning plane for an appliance, and a medium storing the program. An electric-field vector at an origin is calculated, based on potential-difference vectors in respective coordinate directions calculated depending upon a detected signal of at least a magnitude and phase of an electric-field component current by arranging a scanning electric-field sensor at an origin of a desired coordinate system established near an object-to-be-measured, signals detected at respective coordinates by sequential movement to desired coordinates on respective coordinate axes, and a detected reference signal of at least a magnitude and phase of a current by fixedly arranging a fixed magnetic-field sensor close to the object-to-be-measured, and distances between coordinates calculated based on the coordinates the scanning electric-field sensor is arranged and the origin.

19 Claims, 11 Drawing Sheets

U.S. PATENT DOCUMENTS

| | | | |
|---|---|---|---|
| 6,759,850 B2 * | 7/2004 | Harzanu et al. | 324/522 |
| 6,804,617 B2 * | 10/2004 | Kitayoshi | 702/75 |
| 6,922,634 B2 * | 7/2005 | Odakura et al. | 701/211 |
| 2006/0279273 A1 * | 12/2006 | Kazama | 324/117 R |

OTHER PUBLICATIONS

Kazama. (Compliance Engineering Annual Reference Guide 2002).*

Weinzierl et al. (Infrared and Millimeter Waves, 2000. Conference Digest. 2000 25th International Conference on Sep. 12-15, 2000 pp. 353-354.*

* cited by examiner

METHOD, APPARATUS, AND PROGRAM FOR MEASURING AN ELECTROMAGNETIC FIELD AND MEDIUM STORING THE PROGRAM

BACKGROUND OF THE INVENTION

1. Field of the Invention

The present invention relates to a method, apparatus and program for measuring an electric-field vector, electromagnetic-field vector and distant electromagnetic-field intensity of an electromagnetic field formed by an electromagnetic wave radiated, for example, from an appliance, and to a medium storing the program.

2. Description of the Related Technology

Recently, the electromagnetic wave radiated from an appliance is particularly problematic. The industrial associations have the standards regulating radiant electromagnetic wave intensity permitted. In an effort to reduce the unwanted radiant electromagnetic waves, appliance manufacturers have taken various measures (EMC measures) in the development. It is necessary to perform a measurement of the intensity of an electromagnetic filed located nearly several meters away from an object-to-be-measured within an open site or radio darkroom, in order to confirm whether the electronic appliance concerned satisfies the standard.

However, such an open site or radio darkroom requires equipments great in scale and thus vast investment. Besides, for each measurement, the object-to-be-measured must be inconveniently carried into an open site or radio darkroom. This increases the cost of the development of an electronic appliance.

In order to solve the problem, there is conventionally a structure having a scanning magnetic-field sensor to scan on each of measurement positions established in a space surrounding an object-to-be-measured, and a fixed magnetic-field sensor fixedly arranged near the object-to-be-measured, thereby calculating a distribution of magnetic-field intensity, direction and phase from detected signals by both sensors and determining a distant electromagnetic-field intensity from the magnetic-field intensity, direction and phase thus calculated (see JP-A-2004-69372, for example).

However, the existing method has its own limitation. Where a loop antenna is used as a scanning magnetic-field sensor for example, the scanning interval of the sensor and the size of the whole structure are still too big because of the relatively large size of the antenna's loop area.

Meanwhile, the intensity of electromagnetic field at a distance from an object-to-be-measured can be determined from a distribution of magnetic-field intensities, directions and phases at a scanning position. However, because of the incapability of knowing the distribution of electric-field intensities, directions and phases on the scanning plane, it is impossible to grasp the direction of an electromagnetic wave actually radiated from the electronic appliance. Thus, the EMC measure is limited in respect of the effect upon the electronic appliance.

Meanwhile, where using an electric-field sensor or electromagnetic-field sensor in place of the magnetic-field sensor, the existing method is merely to measure an electric-field intensity, etc. vertical to the scanning plane on a measuring-position basis, wherein the intensity, direction and phase of electric field is unknown over the scanning plane as to the electronic appliance.

SUMMARY OF THE INVENTION

It is an object of the present invention to provide a method, apparatus and program for calculating an electric-field vector that allows for grasping the intensity, direction and phase of electric field on a scanning plane for an electric appliance, and a medium storing the program.

Another object of the invention is to provide a method, apparatus and program for calculating an electromagnetic-field vector and determining an electromagnetic-wave radiation pattern and effective for EMC measure for an electronic appliance, and a medium storing the program.

A further object of the invention is to provide a method, apparatus and program for calculating a distant electromagnetic-field intensity that is further improved in the resolving power of electromagnetic-field intensity at a distance by means of an apparatus small in scale, and a medium storing the program.

In order to achieve the object, the invention proposes a method for calculating an electric-field vector as to an electromagnetic field formed by an electromagnetic wave radiated from an object-to-be-measured, the method comprising: a step of detecting a reference signal including at least a magnitude and phase of one of electric-field and magnetic-field component currents by fixedly arranging a first probe near an object-to-be-measured; a step of detecting a first signal including at least a magnitude and phase of an electric-field component current at a first coordinate, by arranging a second probe at the first coordinate of a desired coordinate system established near the object-to-be-measured; a step of detecting a second signal including at least a magnitude and phase of an electric-field component at a second coordinate, the second probe being arranged at the second coordinate; a step of calculating a potential difference between the first and second signals depending upon the reference signal; a step of calculating a distance between the first and second coordinates; and a step of calculating an electric-field vector on the first coordinate depending upon the potential difference and the distance (first proposal).

According to the invention, a potential difference vector in coordinate directions at a first coordinate, for example, at the origin is detected depending upon the first and second signals at coordinates at which the second probe is arranged and the reference signal detected by the first probe. A distance between each coordinate and the origin is calculated depending upon the coordinate as a second coordinate at which the second probe is arranged. An electric-field vector at the origin is calculated depending upon the potential-difference vector and distance calculated. By scanning the second probe over a plane including, for example, the origin, a distribution of electric-field vectors can be calculated on the plane.

Meanwhile, in order to achieve the object, the invention proposes a method for calculating an electromagnetic-field vector, comprising: the steps described in the first proposal; a step of detecting a third signal including at least a magnitude and phase of a magnetic-field component current by arranging a third probe at a third coordinate; and a step of calculating a magnetic-field vector on the third coordinate depending upon the third signal and the reference signal (second proposal).

According to the invention, a magnetic-field vector in a position where the third probe is arranged is calculated depending upon the third signal including a magnitude and phase of a magnetic-field component current at a third coordinate where the third probe is arranged and the reference signal detected by the first probe. This makes it possible to calculate a pointing vector representative of a power density flowing through the plane including the origin.

Meanwhile, in order to achieve the object, the invention proposes a method for calculating an electromagnetic-field vector, comprising: the steps described in the first proposal; and a step of calculating a magnetic-field vector on the first coordinate depending upon a detection signal including a magnitude and phase of a magnetic-field component current due to the second probe at the first coordinate and the reference signal (third proposal).

According to the invention, calculated are an electric-field vector on the first coordinate, for example, the origin, and a magnetic-field vector on the origin depending upon the signal, including a magnitude and phase of magnetic-field component current, detected by the second probe at the origin and the reference signal detected by the first probe. This allows for calculating a pointing vector representative of a power density flowing through the plane including the origin.

Meanwhile, in order to achieve the object, the invention proposes a method for calculating a distant electromagnetic-field intensity, comprising: the steps described in the first proposal; and a step of calculating an electromagnetic-field intensity at a desired point distant from the object-to-be-measured, depending upon the electric-field vector distribution (fourth proposal).

According to the invention, electric-field vectors at respective coordinates are calculated by sequentially moving the second probe to a desired coordinate on a plane including the first coordinate, for example, the origin. An electromagnetic field intensity at a desired point distant from the object-to-be-measured is calculated depending upon the electric-field distribution calculated. Accordingly, a distant electromagnetic-field intensity can be calculated without using an equipment great in scale, such as an open site or a radio darkroom. Where using a second probe made up of a monopole antenna for example, the monopole antenna has an infinitesimal tip area as compared to a loop area of the loop antenna. Thus, the second probe can be reduced in size, to reduce the scanning interval.

Meanwhile, in order to achieve the object, the invention proposes a method for calculating a distant electromagnetic-field intensity, comprising: the steps of described in the second proposal; a step of calculating a distribution of electric-field vectors on respective coordinates by sequentially moving the second probe to a desired coordinate; a step of calculating a distribution of magnetic-field vectors on respective coordinates by sequentially moving the third probe to a desired coordinate; and a step of calculating an electromagnetic-field intensity at a desired point distant from the object-to-be-measured depending upon the electric-field vector distribution and the magnetic-field vector distribution (fifth proposal).

According to the invention, electric-field vectors at respective coordinate are calculated by sequentially moving the second probe to a desired coordinate on a plane including the first coordinate, for example, the origin. Electromagnetic-field vectors at respective coordinates are calculated by sequentially moving the third probe to a desired coordinate on the plane including the first coordinate, for example, the origin. A distant electromagnetic-field intensity at a distant desired point from the object-to-be-measured can be calculated from the calculated distribution of electric-field and magnetic-field vectors. Accordingly, a distant electromagnetic-field intensity can be calculated without using an equipment great in scale, such as an open site or a radio darkroom. Where using a second probe made up of a monopole antenna for example, the monopole antenna has an infinitesimal tip area as compared to a loop area of the loop antenna. Thus, the second probe can be reduced in size, to reduce the scanning interval.

Meanwhile, in order to achieve the object, the invention proposes a method for calculating a distant electromagnetic-field intensity, comprising: the steps described in the third proposal; a step of calculating a distribution of electric-field vectors and distribution of magnetic-field vectors on respective coordinates by sequentially moving the second probe to a desired coordinate; and a step of calculating an electromagnetic-field intensity at a desired point distant from the object-to-be-measured depending upon the distribution of electric-field vectors and distribution of magnetic-field vectors (sixth proposal).

According to the invention, electric-field and magnetic-field vectors at respective coordinate are calculated by sequentially moving the second probe to a desired coordinate on a plane including the first coordinate, for example, the origin. An electromagnetic-field intensity at a desired point distant from the object-to-be-measured can be calculated depending upon the distribution of electric-field and magnetic-field vectors calculated. Accordingly, a distant electromagnetic-field intensity can be calculated without using an equipment great in scale, such as an open site or a radio darkroom. Where using a second probe made up of a monopole antenna for example, the monopole antenna has an infinitesimal tip area as compared to a loop area of the loop antenna. Thus, the second probe can be reduced in size, to reduce the scanning interval.

According to the invention, by scanning the probe to a desired coordinate on a plane including a first coordinate, for example, the origin, it is possible to calculate a distribution of electric-field vectors on the plane. This allows for grasping an electric-field intensity, direction and phase on the scanning plane.

Meanwhile, because the invention can calculate a pointing vector representative of a power density flowing the space including the origin, it can grasp the traveling direction of an electromagnetic wave radiated from the object-to-be-measured. This makes it to easily recognize an electromagnetic-wave radiation pattern, thus effective in taking an MC countermeasure for an electronic appliance, e.g. effective in analyzing an antenna to actively radiate an electromagnetic wave.

Meanwhile, according to the invention, a distant electromagnetic-field intensity can be calculated without using an equipment great in scale, such as an open site or a radio darkroom. Where using a second probe made up of a monopole antenna for example, the monopole antenna has an infinitesimal tip area as compared to a loop area of the loop antenna. Thus, the second probe can be reduced in size, to reduce the scanning interval. This makes it possible to easily develop/design an electronic appliance at low cost, and to further improve the intensity resolving power of an electromagnetic field distant far.

DESCRIPTION OF THE PREFERRED EMBODIMENTS

Figure 1:
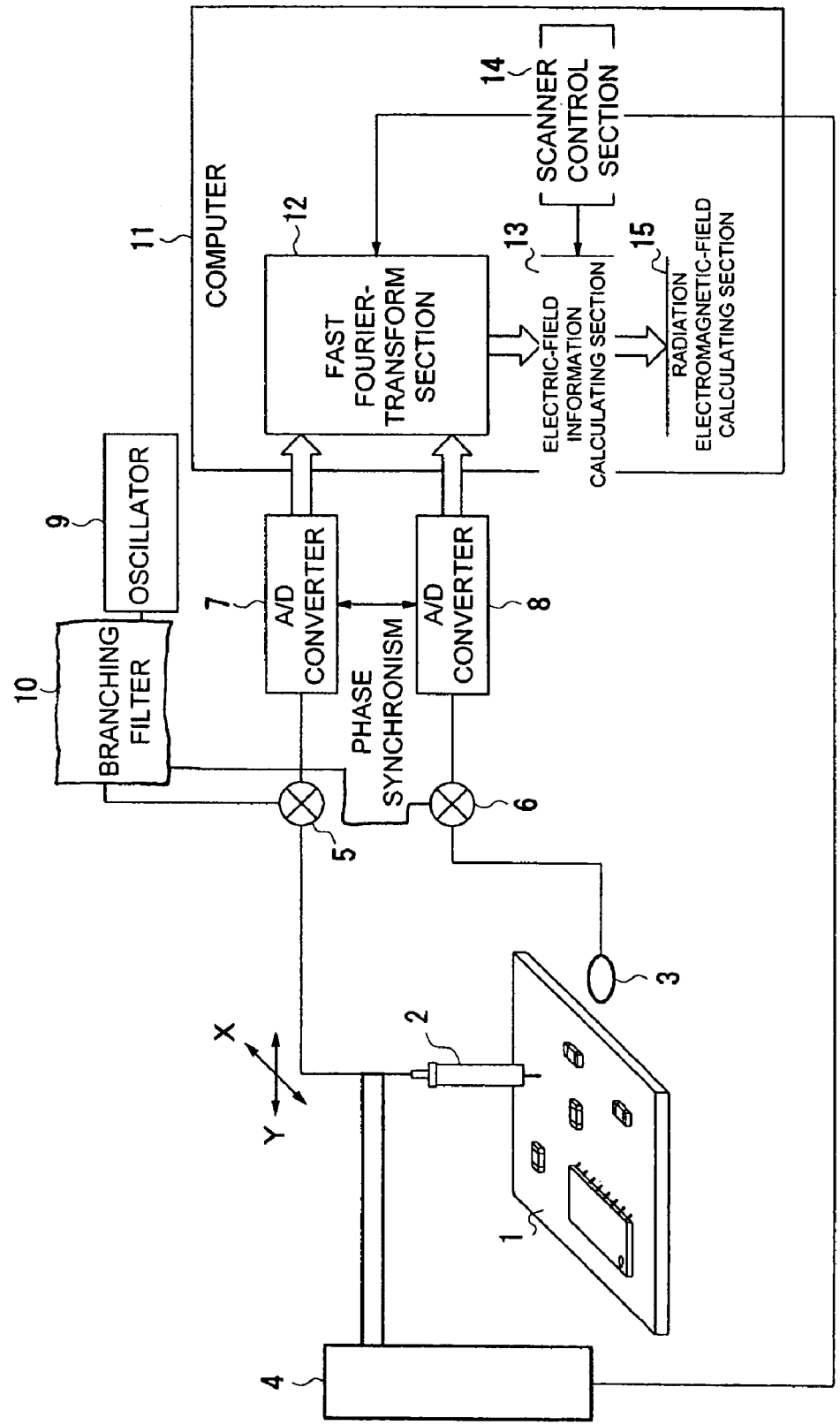
FIG. 1 is a diagram showing a calculator of distant electromagnetic-field intensity in a first embodiment of the present invention.
Figure 2:
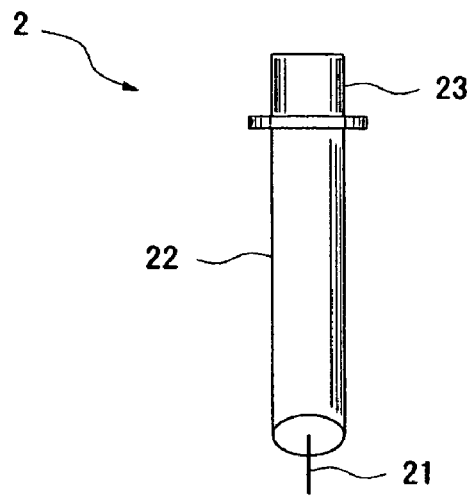
FIG. 2 is a view explaining the structure of a scanning electric-field sensor shown in FIG. 1.
Figure 3:
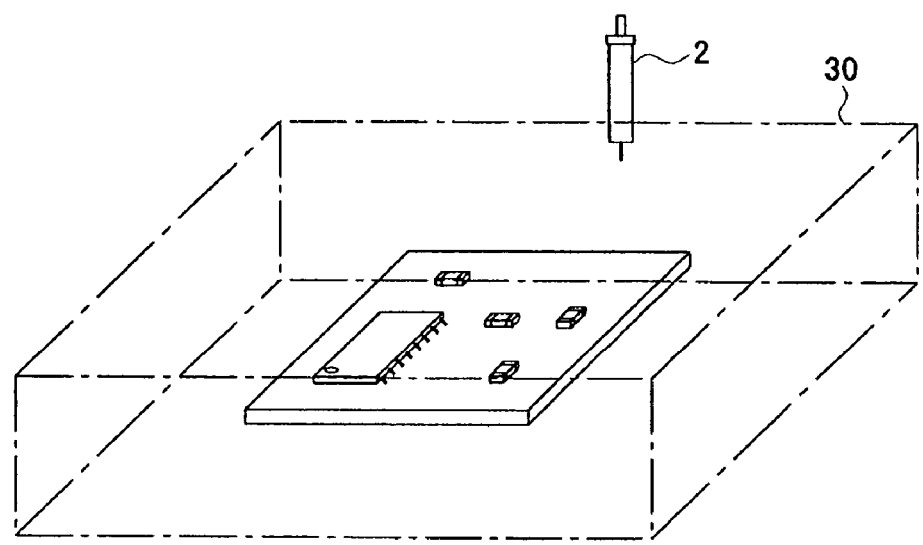
FIG. 3 is a view explaining a scanning plane in the first embodiment of the invention.
Figure 4:
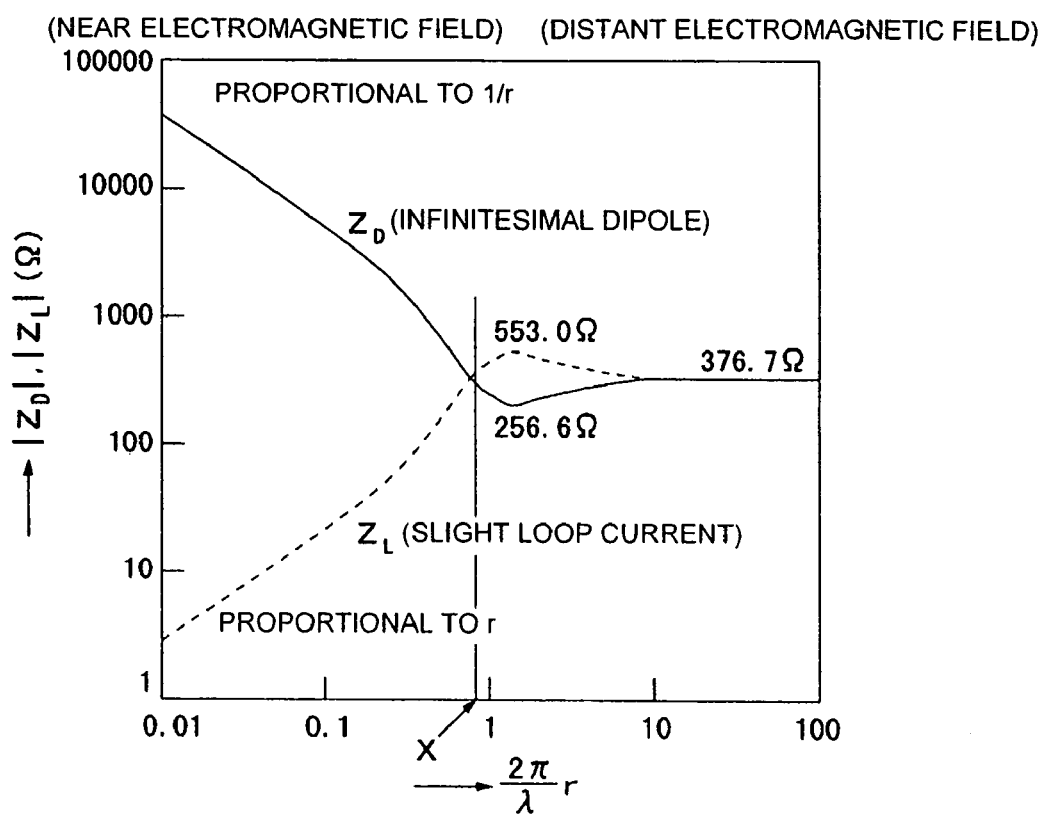
FIG. 4 is a figure showing a wave-impedance-against-distance characteristic of an infinitesimal dipole and slight loop current.
Figure 5:
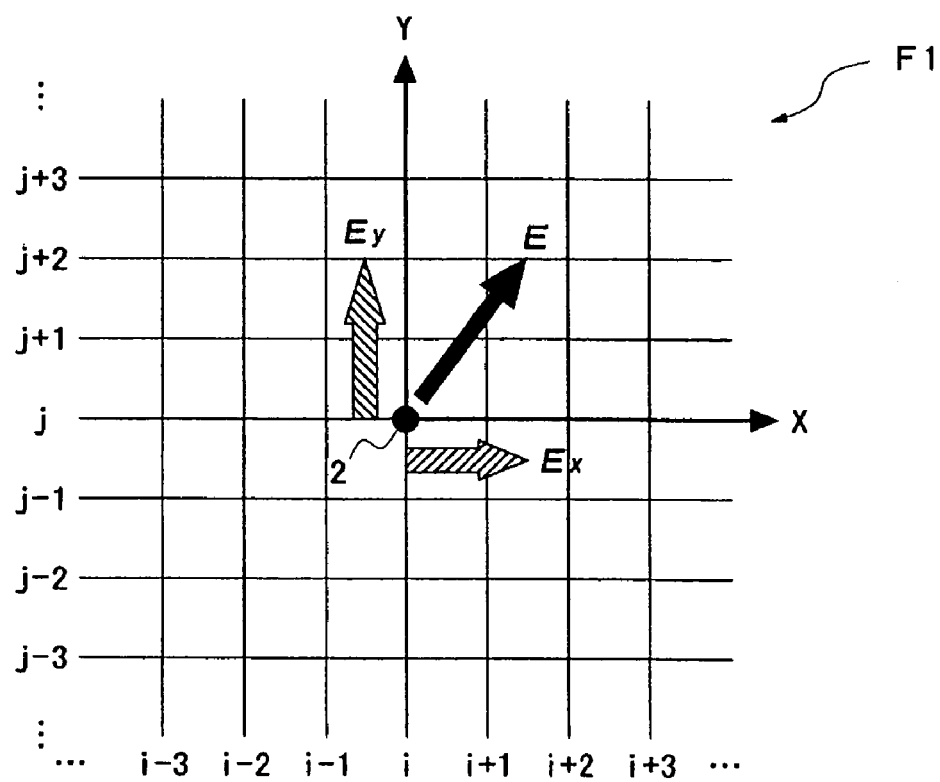
FIG. 5 is a figure explaining an electric-field vector on a scanning plane.
Figure 6:
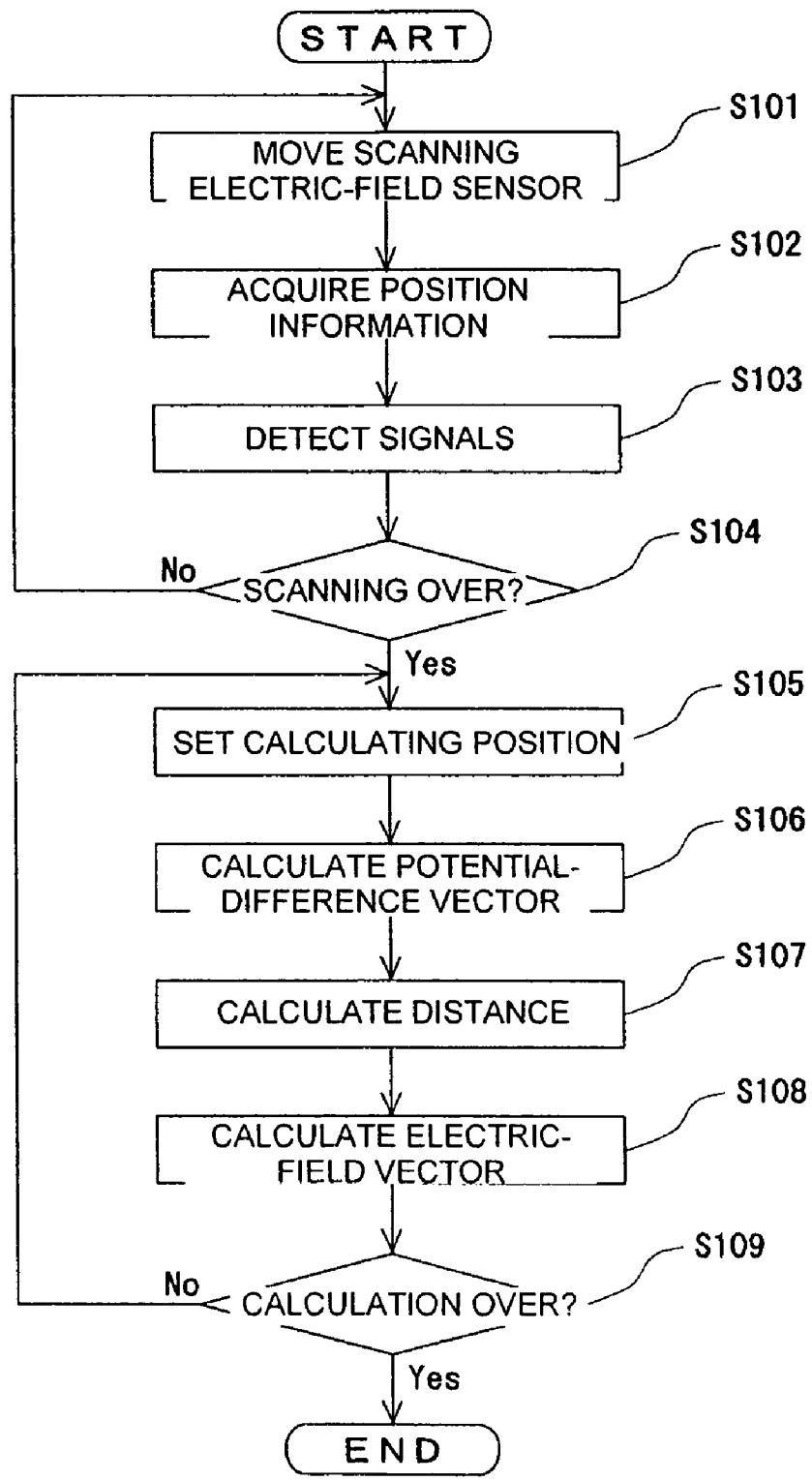
FIG. 6 is a flowchart for calculating an electric-field vector in the first embodiment of the invention.
Figure 7:
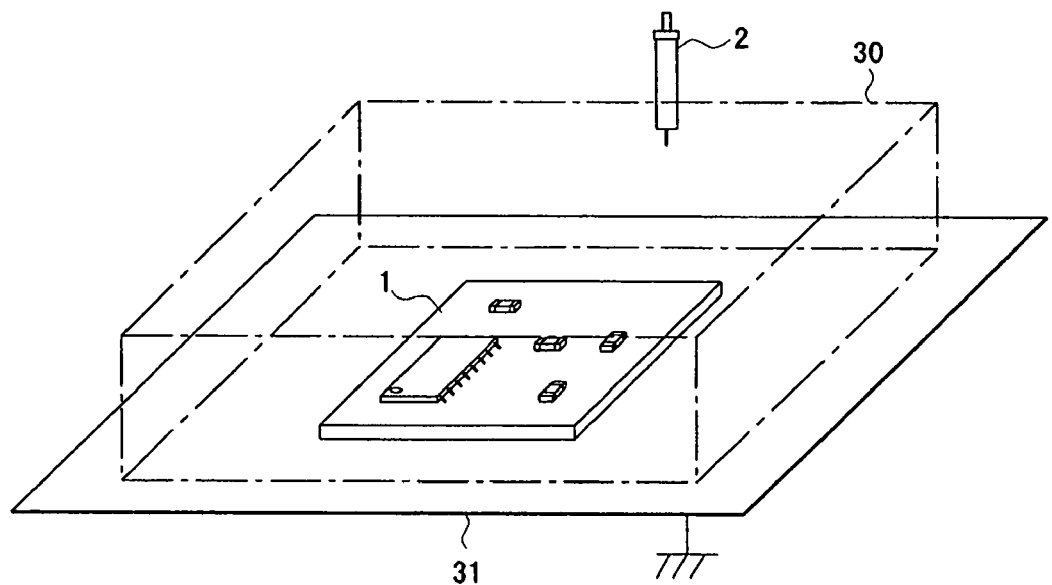
FIG. 7 is a view explaining another example of scanning plane.
Figure 8:
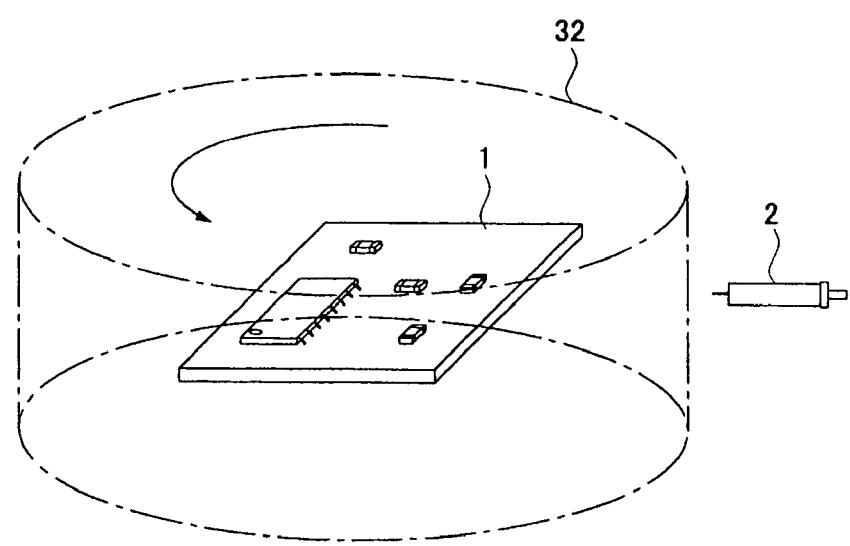
FIG. 8 is a view explaining another example of scanning plane.

FIGS. 1 to 8 illustrates a first embodiment of the present invention, wherein FIG. 1 is a diagram showing a distant electromagnetic-field intensity calculator in a first embodiment of the invention, FIG. 2 is a view explaining the structure of a scanning magnetic-field sensor shown in FIG. 1, FIG. 3 is a view explaining a scanning plane in the first embodiment of the invention, FIG. 4 is a figure showing a wave impedance-against-distance characteristic of an infinitesimal dipole and slight loop current, FIG. 5 is a figure explaining an electric-field vector on the scanning plane, FIG. 6 is a flowchart of calculating an electric-field vector in the first embodiment, FIG. 7 is a view showing another example of scanning plane, and FIG. 8 is a is a view explaining another example of scanning plane.

Description is now made on the principle in the present invention. The invention is also described in a foreign priority patent application, e.g., Japanese Patent Application No. 012338/2005 filed on Jan. 20, 2005. The entire disclosure of the foreign priority patent application is incorporated herein by reference.

According to the Love's equivalence theorem, the electromagnetic field (radiation electromagnetic field) formed by a radiation source can be determined without knowing a radiation source, by considering as a wave source a virtual equivalent plane established around the radiation source. Specifically, a radiation electromagnetic field can be determined by determining a through-equivalent-plane magnetic current $J_m$ and through-equivalent-plane electric current $J_e$ from the electric field $E_1$ and magnetic field $H_1$ on the equivalent plane, to consider the through-equivalent-plane magnetic current $J_m$ and through-equivalent-plane electric current $J_e$ as radiation sources. More specifically, an electric field E and magnetic field H can be determined by the following equation. Note that E, H, $E_1$, $H_1$, $J_m$, $J_e$ and n-hat (symbol of n affixed with "^" thereon) denote vectors. Note that $\mu_0$ is a magnetic permeability in vacuum, and $\epsilon_0$ is a dielectric constant in vacuum.

$$J_m = E_1 \times \hat{n}$$

$$J_e = \hat{n} \times H_1$$

$$\nabla \times E = -j\omega\mu_0 H - J_m$$

$$\nabla \times E = -j\omega\epsilon_0 E - J_e$$

By thus calculating the electric field $E_1$ and magnetic field $H_1$ as to the equivalent plane, a radiation electromagnetic field at a desired point can be determined.

In the invention, calculation is made for the intensity of an electromagnetic field formed by an electromagnetic wave radiated from an object-to-be-measured 1. Specifically, the intensity of a radiation electromagnetic field is calculated as to a desired point depending upon the intensity, direction and phase of an electric field, at around the object-to-be-measured 1, detected by using a scanning electric-field sensor 2 and a fixed magnetic-field sensor 3. First explained is the theory of the calculation method.

The Love's equivalence theorem includes the Schelkunoffs equivalence theorem as an extension thereof. With the Schelkunoffs equivalence theorem, a radiation electromagnetic field can be determined by determining a through-equivalent-plane magnetic current $J_m$ or through-equivalent-plane electric current $J_e$ from any one of an electric field $E_1$ or magnetic field $H_1$ on the equivalent plane. This is due to the consideration of the equivalent plane as an electric wall for the case of a through-equivalent-plane magnetic current $J_m$ and of the equivalent plane as a magnetic wall for the case of a through-equivalent-plane electric current $J_e$.

Here, if considering an actual measurement for any of electric field $E_1$ and magnetic field $H_1$, there is a difficulty in measuring the potential in absolute value. For this reason, in this embodiment, a scanning electric-field sensor 2 made up of a monopole antenna is arranged on the equivalent plane established near the object-to-be-measured 1. By using the scanning electric-field sensor 2, an electric field $E_1$ is calculated. The intensity of an electric field can be determined from a value calculated by dividing the difference between the electric-field component currents outputted as to a measuring point and another point on the equivalent plane, caused due to the electric fields, from the scanning electric-field sensor 2, by a distance between the measuring point and another point on the equivalent plane.

This theory requires calculation of the electric field $E_1$ in terms of vectors. However, as referred later, in this embodiment an electric field in the directions of coordinate axes can be calculated by sequentially moving the scanning electric-field sensor 2, arranged at the origin of a desired coordinate system established near the object-to-be-measured 1, to desired coordinates on respective coordinate axes, wherein phase can be measured by providing a fixed magnetic-field sensor 3 separately from the scanning electric-field sensor 2. This makes it possible to calculate the intensity, direction and phase of an electric field at a measuring point (origin). From now on, the intensity, direction and phase of an electric field is explained as an electric-field vector unless otherwise noted.

In order to determine an electromagnetic field formed by an electromagnetic wave radiated from the object-to-be-measured 1 under application of the Schelkunoffs equivalence theorem, six planes (equivalent plane) are set up in a manner surrounding the object-to-be-measured 1. By scanning the scanning electric-field sensor 2 arranged vertical to the plane, a distribution of electric-field vectors can be obtained as to the scanning plane. An electromagnetic field is provided by an electromagnetic-field distribution determined on the assumption the through-equivalent-plane magnetic current, determined as an exterior product of a on-plane unit normal vector and the electric-field vector, is distributed over six planes presumed as an electric wall. Specifically, it is satisfactory to consider a flow twice the through-equivalent-plane magnetic current. By using the following equation with the consideration of the through-equivalent-plane magnetic current as an infinitesimal dipole, an electric magnetic filed can be calculated.

$$E_r = \frac{Z_0(I_d l)}{\lambda r}\left\{0 + \frac{\lambda}{2\pi r} - j\left(\frac{\lambda}{2\pi r}\right)^2\right\}\cos\theta e^{j(\omega t - 2\pi r/\lambda)}$$

$$E_\theta = j\frac{Z_0(I_d l)}{2\lambda r}\left\{1 - j\frac{\lambda}{2\pi r} - \left(\frac{\lambda}{2\pi r}\right)^2\right\}\sin\theta e^{j(\omega t - 2\pi r/\lambda)}$$

$$H_\phi = j\frac{Z_0(I_d l)}{2\lambda r}\left(1 - j\frac{\lambda}{2\pi r}\right)\sin\theta e^{j(\omega t - 2\pi r/\lambda)}$$

where $(r, \theta, \phi)$ is the point distant from the infinitesimal dipole on a polar coordinate indication, $\omega$ is the angular frequency, l is the length of the infinitesimal dipole, Id is the current flowing through the infinitesimal dipole, $\lambda$ is the wavelength and $Z_0$ is the wave impedance in a space represented by the following equation.

$$Z_0 = \sqrt{\mu_0/\epsilon_0}$$

Referring to FIG. 1, description is now made as to a calculator for a distant electromagnetic-field intensity in the first embodiment. As shown in FIG. 1, there are provided a scanning electric-field sensor 2, a sensor scanner 4 for causing the electric-field sensor 2 to perform a scanning over a predetermined scanning surface established around the object-to-be-measured 1, and a fixed magnetic-field sensor 3 for reference signal detection arranged near the object-to-be-measured 1.

The scanning electric-field sensor 2 has a monopole antenna 21 that is smaller than the loop antenna. The monopole antenna 21 is connected to a central conductor at one end of a coaxial cable 22. The coaxial cable 22 has the other end provided with a coaxial connector 23. The scanning electric-field sensor 2 is capable of detecting an electric-field component current $I_e$ including at least the phase as represented by the following equation.

$$I_e = M \sin(\omega t + \theta)$$

where M is the magnitude of a current, $\omega$ the angular frequency and $\theta$ the phase.

The fixed magnetic-field sensor 3 detects a signal serving as a reference in detecting the phase of a signal detected by the scanning electric-field sensor 2. The fixed magnetic-field sensor 3 may be in any structure provided that it is a sensor arranged close to the object-to-be-measured 1. The present embodiment employs a loop antenna.

The scanning electric-field sensor 2 and the fixed magnetic-field sensor 3 are respectively connected to A/D converters 7, 8 through mixers 5, 6, as shown in FIG. 1. The mixers 5, 6 mix signals from the scanning electric-field sensor 2 and the fixed magnetic-field sensor 3 with reference signals for down conversion generated by an oscillator 9, through distribution by means of a branching filter 10. The output signals from mixers 5 and 6 are fed into the A/D converters 7, 8. The A/D converters 7, 8 convert an input signal into a digital form. The A/D converter 7, 8 are operative in phase synchronism with each other. This can detect a phase difference between the detected signals by the scanning electric-field sensor 2 and the fixed magnetic-field sensor 3. The data converted by the A/D converters 7, 8 is inputted to a computer 11.

The computer 11 has a fast Fourier transform section 12 for Fourier-transforming the input data from the A/D converter 7, 8, an electric-field-information calculating section 13 for calculating an electric-field vector from the converted frequency-based data, and a scanner control section 14 for control of the sensor scanner 4. The fast Fourier transform section 12 and the electric-field-information calculating section 13 operate based upon a control signal from the scanner control section 14, and calculate an electric-field vector on a predetermined scanning plane established near the object-to-be-measured 1. The data calculated is saved in a storage device (not shown), such as a memory or a hard disk. The scanner control section 14 controls the sensor scanner 4 to perform a scanning over each surface of a virtual rectangular-parallelepiped 30 set up in a space in a manner surrounding the object-to-be-measured 1, as shown in FIG. 3.

Referring to FIG. 4, description is now made on how to set up a virtual rectangular parallelepiped 30 as a measuring plane. FIG. 4 is a figure showing a wave-impedance-against-distance characteristic of the infinitesimal dipole and slight loop current. The rectangular parallelepiped 30 at its planes (scanning plane) is preferably set up such that the distance to a wave source is nearer than the distance at which there is a crossing over of the wave impedance based on the infinitesimal dipole and the wave impedance based on the slight loop current in FIG. 4 (distance leftward of the point X in FIG. 4).

Description is now made on how to calculate an electric-field vector as to the scanning plane. As shown in FIG. 5, the scanning electric-field sensor 2 is put at the origin of a desired planar coordinate established on the scanning plane F1 of the rectangular parallelepiped 30, to detect an electric-field current component $I_e$. Then, the scanning electric-field sensor 2 is sequentially moved to desired X and Y coordinates, to thereby detect electric-field component currents $I_e$ at the respective coordinates.

Meanwhile, by comparing between the data from the scanning electric-field sensor 2 and the data from the fixed magnetic-field sensor 3, a phase difference is detected. The electric-field phase on the scanning plane F1 means a phase difference between them, with reference to the detected signal from the fixed magnetic-field sensor 3.

The difference in electric-field component current $I_e$ between the origin and a desired coordinate on the scanning plane F1 is of a potential-difference vector on the central conductor of the monopole sensor 21 wherein the electric-field vector is given by dividing a potential-difference vector by a distance between the origin and the desired coordinate. Because the electric-field vector on a planar coordinate can be thought of as a sum of X and Y component vectors, the electric-field vector E at the origin on the scanning plane F1 can be determined by calculating electric-field vectors $E_X$ and $E_Y$ in respective coordinate directions.

Description herein was on how to calculate an electric vector on a plane (two dimensions). This is similar for a curved surface (three dimensions), i.e. determination is possible from the sum of vectors $E_X$, $E_Y$ and $E_Z$ obtained by sequentially moving the scanning electric-field sensor 2 to desired positions on X, Y and Z axes of a desired space coordinate system. Such determination is similarly possible with a straight line (one dimension).

Description is now made on how to determine an electric-field vector distribution by means of the computer 11. As shown in FIG. 6, the scanner control section 14 causes the scanning electric-field sensor 2 to sequentially move on over the scanning plane F1 including the origin (S101). By establishing desired coordinate systems while taking a plurality of movement points as origins, it is possible to calculate electric-field vectors as to a plurality of origins on the scanning plane F1. At the movement point, the scanner control section 14 acquires position information of the scanning electric-field sensor 2 (S102) while the scanning electric-field sensor 2 detects a signal of electric-field component current $I_e$ (S103). The position information and the detected signal are saved, together with the reference signal from the fixed magnetic-field sensor 3, in a storage device, not shown. The processes of S101-S103 are repeated until signals are detected to a predetermined number. Incidentally, position information is for determining a distance, referred later, which may be any of relative and absolute positions.

Unless otherwise noted in the description from now on, electric-field component currents $I_e$ signals are assumably detected by acquiring positional information at a plurality of coordinates $(X_m, Y_m)$ (m= ... i-3, i-2, i-1, i, i+1 ..., n= .. an equally-spaced planar coordinate system as shown in FIG. 5.

When the scanning on the scanning plane F1 is over (S104), the electric-field calculating section 13 sets up coordinates that constitute electric-field vector calculating positions (origins) from a plurality of coordinates saved (S105), calculates potential-difference vectors depending upon the calculating-position (origin) signal, the detected signal as to a coordinate adjacent to the origin by one in X and Y coordinate positions, and the reference signal due to the fixed magnetic-field sensor 3 (S106), calculates distances between the relevant coordinate and the calculating position (origin) depending upon the relevant coordinate position information (S107), and calculates an electric-field vector based on the potential-difference vectors and distances thus calculated (S108). The result of calculation is saved in a storage device, not shown.

For example, in calculating an electric-field vector at coordinate $(X_i, Y_j)$, potential-difference vectors on respective axes are calculated by measuring the difference between the detection signals at $(X_{i+1}, Y_j)$ and $(X_i, Y_{j+1})$. By determining the distance from position information about $(X_{i+1}, Y_j)$ and $(X_i, Y_{j+1})$, electric-field vectors in respective coordinate directions are calculated. By taking a sum over the both vectors, calculated is an electric-field vector on coordinate $(X_i, Y_j)$.

The electric-field-information calculating section 13 repeats the process of S105-S108 until electric vectors are calculated as to all the points the scanning electric-field sensor 2 detected signals. Due to this, electric-field vector distribution can be determined as to the scanning plane F1 (S109).

Additionally, this embodiment calculated the potential-difference vectors through use of the signal detected at the coordinate adjacent by one in X and Y coordinate positions. It is also possible to use at a coordinate adjacent by two or three provided that the two directions are orthogonal on the scanning plane F1.

The computer 11 has, furthermore, a radiation electromagnetic-field calculating section 15 for calculating an electromagnetic-field intensity as to a desired position from the calculated electric-field vector distribution over the scanning plane F1 electric-field-information calculating section 13. In the calculation, used is the Schelkunoff's equivalence theorem as noted before. The calculated electromagnetic-field intensity is saved in a storage device, not shown. The electromagnetic-field intensity and electric-field vector distribution is displayed on a display (not shown).

Meanwhile, in the present embodiment, signal detection was made by moving the scanning electric-field sensor 2 over the scanning plane F1 by means of the scanner control section 14. Alternatively, a plurality of scanning electric-field sensors 2 may be arranged, for example, at respective coordinate $(X_m, Y_n)$ shown in FIG. 5, to detect signals on the entire scanning plane F1 or at coordinates $(X_m, Y_n)$ changed over by switches, etc. This configuration eliminates the need of the sensor scanner 4, further facilitating the size reduction of the apparatus.

In the embodiment, a virtual rectangular parallelepiped 30 was set up in the space surrounding the object-to-be-measured 1 so that scanning can be performed over the respective planes of the rectangular parallelepiped 30. Alternatively, by taking one of the planes as a ground plane 31, scanning may be performed over only the other five planes, as shown in FIG. 7. For certain shapes of the object-to-be-measured 1, scanning may be only over the top and bottom two planes of the object-to-be-measured in a manner neglecting the side planes thereof. Furthermore, as shown in FIG. 8, a virtual circular cylinder 32 may be established to perform a scanning over the side, top and bottom surfaces thereof. Effects are similarly obtainable even by performing a scanning over only one of six planes.

In the embodiment, the fixed magnetic-field sensor 3 made up of a loop antenna was arranged near the object-to-be-measured 1 separately from the scanning electric-field sensor 2, in order to measure the phase of electric field on the scanning plane. Alternatively, a sensor may be provided on the object-to-be-measured 1.

In this manner, according to the structure and operation, the scanning electric-field sensor 2 is arranged at the origin of a desired coordinate system established near an object-to-be-measured 1, to calculate potential-difference vectors in respective coordinate directions at the origin depending upon the detected signals of at least the magnitude and phase of electric-field component current, the signals detected at coordinates by sequential movement to desired positions on respective coordinate axes, the detected reference signal of at least current magnitude and phase by fixedly arranging the fixed magnetic-field sensor 3 close to the object-to-be-measured 3. Depending upon the coordinate the scanning electric-field sensor 2 is arranged, calculated is a distance between the coordinate and the origin. Depending upon the calculated potential-difference vector and distance, calculated is an electric-field vector as to the origin. By scanning the scanning electric-field sensor 2, for example, over the plane including the origin, it is possible to calculate an electric-field vector distribution over the plane, thus allows for grasping the intensity, direction and phase of an electric field on the scanning plane F1.

Meanwhile, by sequentially moving the scanning electric-field sensor 2 to a plurality of coordinate system origins set up on planes including origins, electric-field vectors are calculated as to the respective origins. Depending upon the electric-field vector distribution over the plane calculated, the intensity of an electromagnetic-field is calculated as to a desired position distant far from the object-to-be-measured 1.

This allows for calculating a distant electromagnetic-field intensity without the use of a large-scale equipment, such as an open site or a radio darkroom. In certain embodiments, the scanning electric-field sensor 2 is made up of a monopole antenna 21, which has a tip area infinitesimal as compared to the loop area of a loop antenna. Thus, the scanning electric-field sensor 2 can be reduced in size, thus enabling to reduce the scanning interval. This makes it possible to easily develop/design an electronic appliance at low cost, and to further improve the intensity resolving power of an electromagnetic field.

Now, explanation is made on a second embodiment of the invention.

Figure 9:
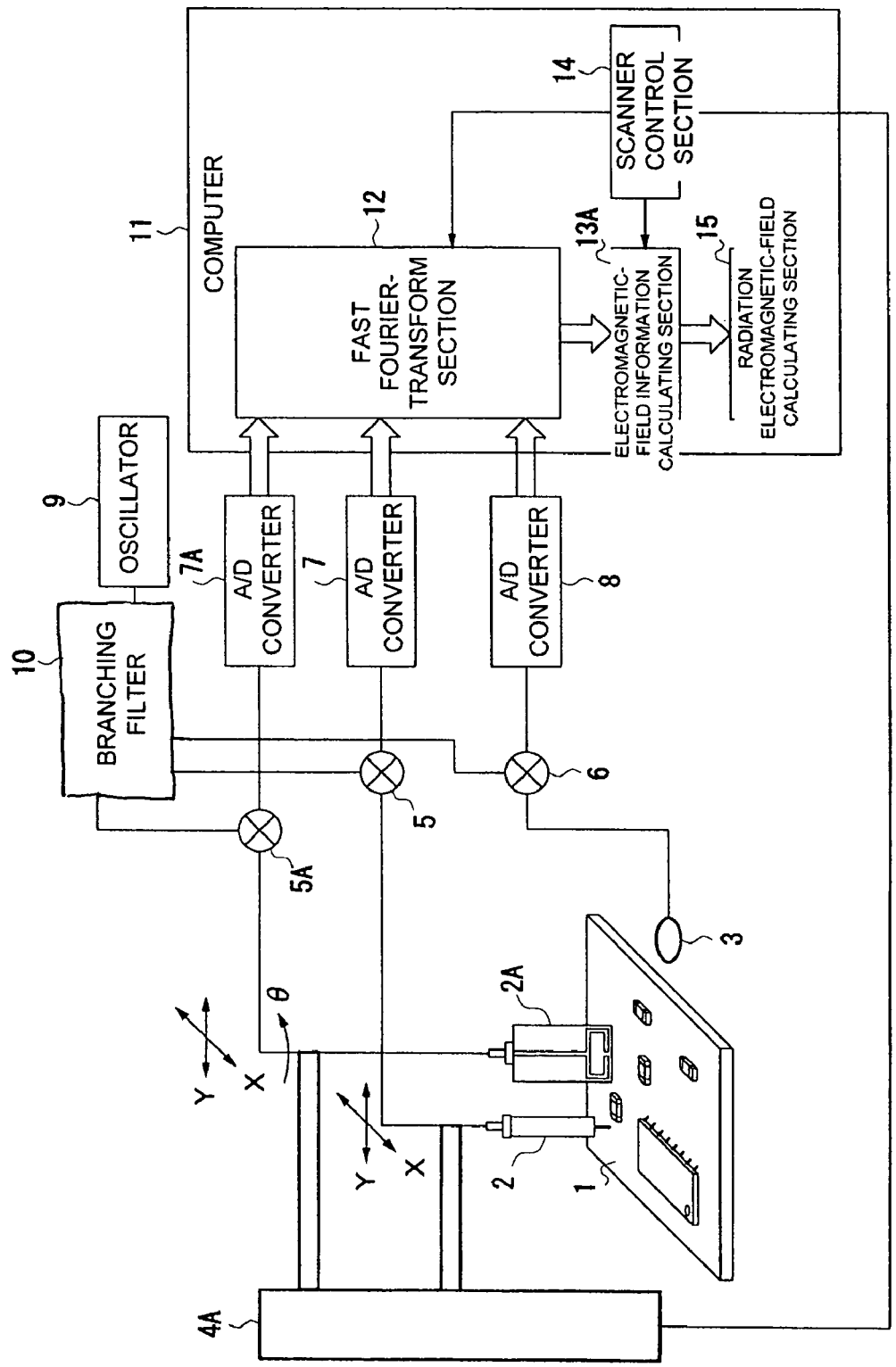
FIG. 9 is a diagram showing a calculator of distant electromagnetic-field intensity in a second embodiment of the invention.
Figure 10:
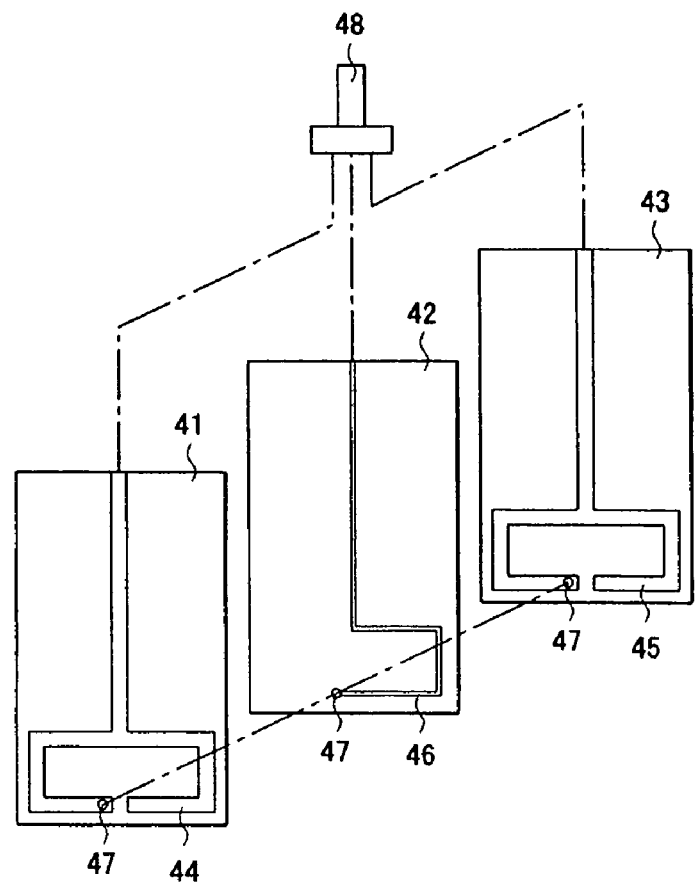
FIG. 10 is a view explaining the structure of a scanning electric-field sensor shown in FIG. 9.
Figure 11:
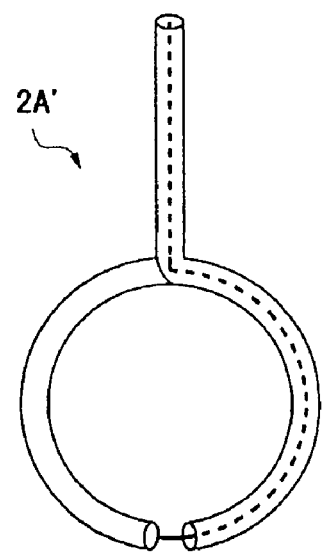
FIG. 11 is a view explaining another scanning magnetic-field sensor.

FIG. 9 is a diagram showing a calculator of distant electromagnetic-field intensity in a second embodiment of the invention, FIG. 10 is a view explaining a structure of a scanning magnetic-field sensor shown in FIG. 9, and FIG. 11 is a view explaining another scanning magnetic-field sensor.

The similar component or operating elements to those in the first embodiment are designated by the same references, to omit the explanations thereof.

The second embodiment is different from the first embodiments in that a scanning magnetic-field sensor 2A is used in addition to the scanning electric-field sensor 2.

In this embodiment, there is arranged a scanning magnetic-field sensor 2A made up of a loop antenna on an equivalence plane established near an object-to-be-measured 1. Using the scanning magnetic-field sensor 2A, measurement is made for magnetic field $H_1$. The magnitude of magnetic field can be determined with using the following equation by means of a magnetic-field component current $I_m$ detected at the magnetic-field sensor 2A. It is assumed that, in the following equation, a 50-Ω load is connected in series to a loop output.

$$I_m = 2\pi f \mu S H \sin \theta / (50 \times 2)$$

where f is the frequency, μ is the magnetic permeability, S is the loop area, H is the magnetic field, and θ is the angle between the magnetic field and the loop plane.

This theory requires the magnetic field $H_1$ in terms of vectors. This embodiment calculates it by detecting the magnetic-field component current $I_m$ twice at the same location, by changing the direction of the magnetic-field sensor 2A relative to the magnetic field by 90 degrees, as referred later.

A sensor scanner 4A causes a scanning electric-field sensor 2 to perform a scanning, and a scanning magnetic-field sensor 2A to perform a scanning over the same scanning plane as the scanning electric-field sensor 2. A mixer 5A and A/D converter 7A are similar in structure and operation to the mixer 5 and A/D converter 7, and hence the explanation thereof is omitted.

The scanning magnetic-field sensor 2A is made in a shielded-loop structure. In this embodiment, a shielded-loop structure is realized by a multi-layer printed wiring board, as shown in FIG. 10. Specifically, shielding patterns 44, 45 are provided on the first and third layers 41, 43 while a pattern 46 corresponding to a central line is provided on the second layer 42. The connections between the patterns 44-46 are realized by means of through-holes 47. Meanwhile, the patterns 44-46 are connected to a coaxial connector 48 provided at an end of the wiring board. With this structure, the present embodiment functions as a magnetic sensor similarly to the ordinary shielded-loop antenna as shown in FIG. 11. Although the embodiment used the sensor using a multi-layer printed wiring board, the invention can be implemented even with the usual shielded-loop antenna 2A'. However, the sensor using a multi-layer printed wiring board is easy to reduce the size and ready to access an object-to-be-measured, and hence is preferred to the usual shielded-loop antenna 2A' in that its resolving power is expected to improve.

Description is now made on how to calculate a magnetic-field vector in an electromagnetic-field-information calculating section 13A.

Note that the steps to calculate an electric-field vector is similar to that of the first embodiment and hence the explanation thereof is omitted.

The electromagnetic-field-information calculating section 13A calculates the intensity and direction of magnetic field by taking a sum and difference of two of the data, from the scanning magnetic-field sensor 2A, measured by changing the angle by 90 degrees to the same scanning plane as the scanning electric-field sensor 2. Meanwhile, by comparing the data from the scanning magnetic-field sensor 2A with the data from the fixed magnetic-field sensor 3, a phase difference is detected between them.

Meanwhile, the electromagnetic-field-information calculating section 13A calculates a pointing vector as an external product of electric-field and magnetic-field vectors on the scanning plane. The result of calculation is saved in a storage device, not shown, and displayed as a current density flowing through the scanning surface on the display, not shown.

A radiation electromagnetic-field calculating section 15 calculates the intensity of an electromagnetic field in a desired position, from the pointing vector on the scanning plane.

According to the structure and operation, an electric-field vector on the origin can be calculated in the same way as described in the first embodiment. Furthermore, a magnetic-field vector can be calculated as to the arrangement point of the scanning magnetic-field sensor 2A, depending upon a detected signal by the scanning magnetic-field sensor 2A, arranged on a plane including the origin and for detecting a signal including at least the magnitude and phase of a magnetic-field component current, and a reference signal detected by the fixed magnetic-field sensor 3. Because a pointing vector representative of a power density flowing through the plane including the origin is calculated, it is possible to grasp a traveling direction of an electromagnetic wave radiated from the object-to-be-measured 1. This makes it to easily recognize an electromagnetic-wave radiation pattern, thus effective in the development of an electronic appliance, e.g. effective in analyzing an antenna to actively radiate an electromagnetic wave.

Description is now made on a third embodiment of the invention.

Figure 12:
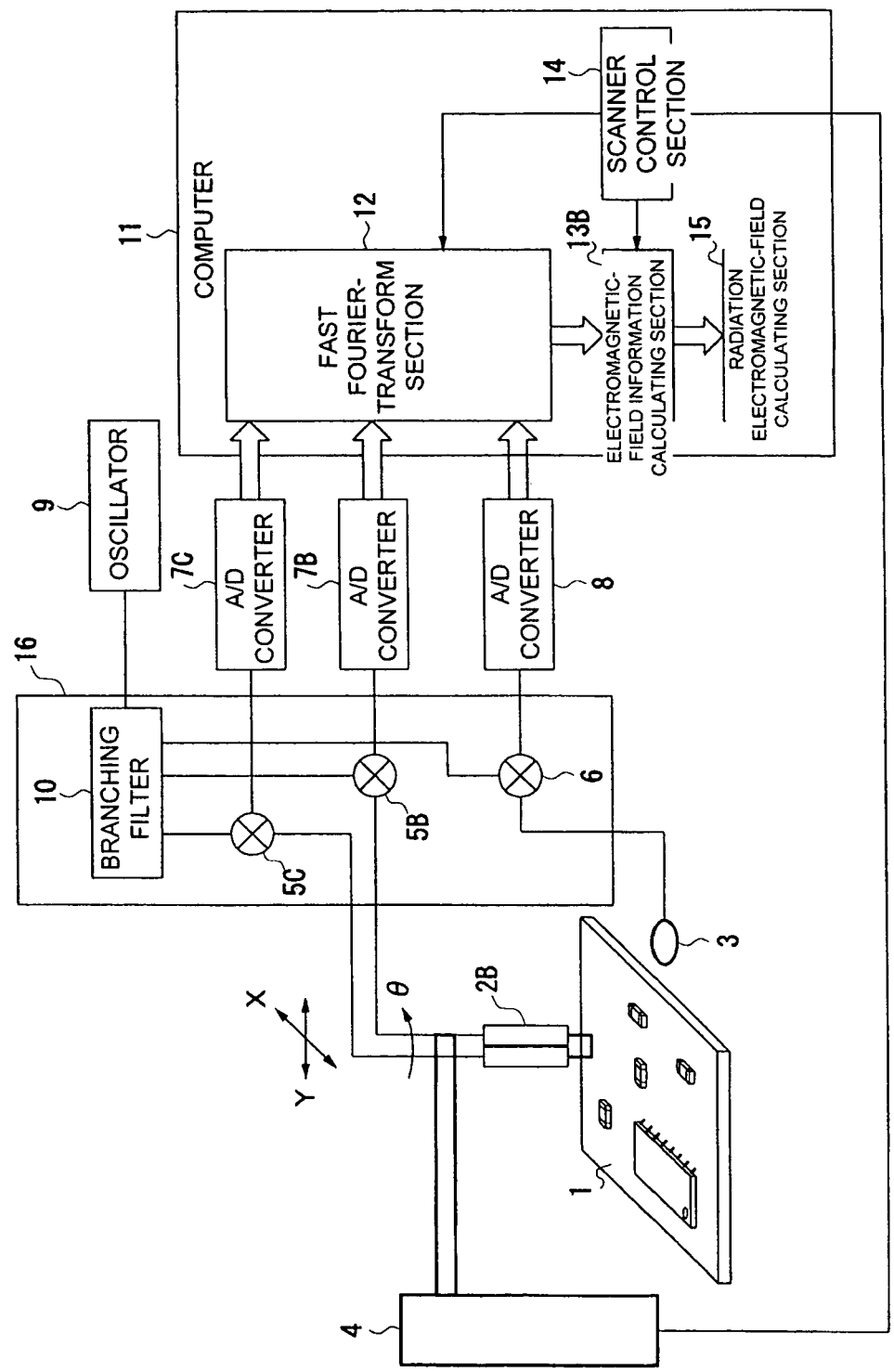
FIG. 12 is a diagram showing a calculator of distant electromagnetic-field intensity in a third embodiment of the invention.
Figure 13:
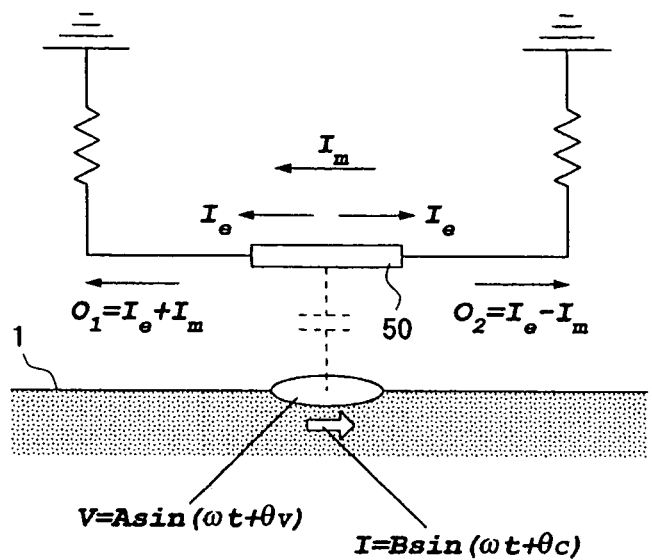
FIG. 13 is a figure explaining the operation principle of the third embodiment of the invention.
Figure 14:
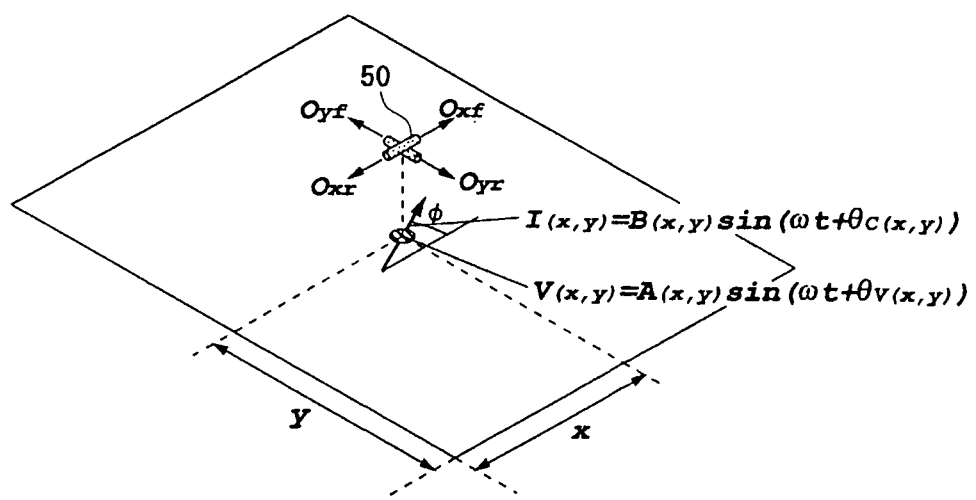
FIG. 14 is a figure explaining the operation principle of the third embodiment of the invention.
Figure 15:
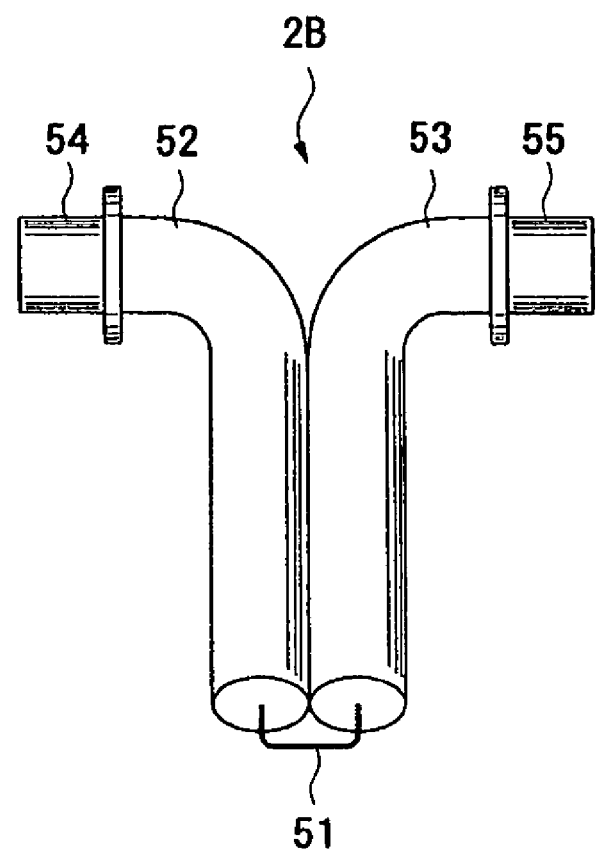
FIG. 15 is a view explaining a scanning electromagnetic-field sensor shown in FIG. 12.

FIG. 12 is a diagram showing a distant electromagnetic-field intensity calculator in a third embodiment of the invention, FIG. 13 is a figure explaining the operation principle in the third embodiment of the invention, FIG. 14 is a figure explaining the operation principle in the third embodiment of the invention, and FIG. 15 is a view explaining a scanning electromagnetic-field sensor shown in FIG. 12.

The third embodiment is different from the first embodiments in that a scanning electromagnetic-field sensor 2B is used in place of the scanning electric-field sensor 2.

The similar component elements or operating elements to those in the first embodiment are designated by the same references, to omit the explanations thereof.

Referring to FIGS. 13 and 14, description is made on the operation principle of the present embodiment.

It is assumed that a voltage V (=A sin(ωt+θ$_v$)) and current I (=B sin(ωt+θ$_c$)) at a certain frequency exists at a certain point of an object-to-be-measured 1, as shown in FIG. 13. Immediately above the point, a linear infinitesimal conductor 50 is arranged having respective ends terminated with impedances equal in value. In this case, an electric-field component current I$_e$ is caused on the conductor 50 by an electric-field-coupling with the voltage V while a magnetic-field component current I$_m$ is caused thereon by a magnetic-field-coupling with the current I. Accordingly, the conductor 50 has, at its ends, output currents O$_1$ and O$_2$ that are each given by the resulting current of electric-field component current I$_e$ and magnetic-field component current I$_m$. Here, the electric-field component currents I$_e$, outputted at the ends of the conductor 50, are in phase with each other whereas the magnetic-field component currents I$_m$ are in reverse phase to each other. Namely, the electric-field component current I$_e$ changes depending upon a direction of the conductor 50 whereas the magnetic-field component current I$_m$ does not rely upon the direction of the conductor 50. The present embodiment utilizes this fact, i.e. an electric-field vector and magnetic-field vector is calculated in terms of the conductor 50 position by calculating electric-field and magnetic component currents based on a plurality of output currents mutually different in output directions. The method is further detailed below.

In FIG. 13, the output currents O$_1$ and O$_2$, at the ends of the conductor 50, are expressed by equations (1) and (2), respectively.

$$O_1 = \alpha A \sin(\omega t + \theta_v) + \beta B \sin(\omega t + \theta_c) \quad (1)$$

$$O_2 = \alpha A \sin(\omega t + \theta_v) - \beta B \sin(\omega t + \theta_c) \quad (2)$$

where α and β are coefficients. Accordingly, the electric-field component current I$_e$ and the magnetic-field component current I$_m$ flowing through the conductor 50 can be calculated by taking a sum over and a difference between the output currents O$_1$, O$_2$ at both ends, as in equations (3) and (4).

$$I_e = (O_1 + O_2)/2 \quad (3)$$

$$I_e = (O_1 - O_2)/2 \quad (4)$$

By using the infinitesimal conductor 50 as an electromagnetic-field sensor, it is possible to calculate the intensity of an electromagnetic field including a positional phase of the conductor 50 from the Schelkunoff's equivalence theorem.

Referring to FIG. 14, description is now made on the case taking account of the direction of electromagnetic field on a plane.

It is assumed that there exists a voltage V (A=$_{(x,y)}$sin(ωt+θ$_v$)) and a current I(=B$_{(x,y)}$sin(ωt+θ$_c$)) flowing in a direction φ, at a point (x, y) on an X-Y plane. In this case, relational equations, as measured in two directions orthogonal to each other by rotating the conductor 50 at immediately above the point (x, y), are expressed by equations (5)-(8).

$$O_{xf} = \alpha A_{(x,y)}\sin(\omega t + \theta_{v(x,y)}) - \beta B_{(x,y)}\sin(\omega t + \theta_{c(x,y)})\cos\phi \quad (5)$$

$$O_{xr} = \alpha A_{(x,y)}\sin(\omega t + \theta_{v(x,y)}) + \beta B_{(x,y)}\sin(\omega t + \theta_{c(x,y)})\cos\phi \quad (6)$$

$$O_{yf} = \alpha A_{(x,y)}\sin(\omega t + \theta_{v(x,y)}) - \beta B_{(x,y)}\sin(\omega t + \theta_{c(x,y)})\sin\phi \quad (7)$$

$$O_{yr} = \alpha A_{(x,y)}\sin(\omega t + \theta_{v(x,y)}) + \beta B_{(x,y)}\sin(\omega t + \theta_{c(x,y)})\sin\phi \quad (7)$$

From these relational equations, the relationship of equations (9)-(11) is determined.

$$O_{xf} + O_{xr} = O_{yf} + O_{yr} = 2\alpha A_{(x,y)}\sin(\omega t + \theta_{v(x,y)}) \quad (9)$$

$$O_{xf} - O_{xr} = -2\beta B_{(x,y)}\sin(\omega t + \theta_{c(x,y)})\cos\theta \quad (10)$$

$$O_{yf} - O_{yr} = -2\beta B_{(x,y)}\sin(\omega t + \theta_{c(x,y)})\sin\theta \quad (11)$$

By solving those, an electric-field vector and magnetic-field vector can be calculated in terms of the conductor 50 position. Accordingly, by scanning and rotating the conductor 50 over each surface of a virtual rectangular parallelepiped 30 established in the surrounding space of an object-to-be-measured 1, it is possible to obtain electric-field and magnetic-field vector distributions.

Referring to FIGS. 12 and 15, description is made on the calculator in this embodiment. Incidentally, mixers 5B, 5C and A/D converters 7B, 7C are similar in structure and operation to the mixer 5 and A/D converter 7, and hence the explanation thereof is omitted.

A scanning electromagnetic-field sensor 2B has a loop antenna 51, as shown in FIG. 15. The loop antenna 51 is a conductor in a loop form not having a shield. In this embodiment, the loop antenna 51 is made as a square loop antenna for easier accessing an object-to-be-measured 1. The loop antenna 51 has both ends respectively connected with central conductors of the coaxial cables 52, 53. The coaxial cables 52, 53 have the other ends respectively provided with connectors 54, 55. The connectors 54, 55 are connected to a frequency converter 16, to match the characteristic impedance between one end of the loop antenna 51 and the frequency converter 16 and between the other end of the loop antenna 51 and the frequency converter 16. In the embodiment, the scanning electromagnetic-field sensor 2B is prepared by making a coaxial cable having an outer conductor of copper, a dielectric of fluorinated resin, a characteristic impedance 50Ω and a diameter of approximately 1 mm.

The scanning electromagnetic-field sensor 2B has an electric-field sensing characteristic nearly similar to that of the monopole antenna. Accordingly, the electric vectors on a scanning plane and distribution thereof can be calculated from the operation principle of the embodiment, similarly to the first embodiment.

Meanwhile, the scanning electromagnetic-field sensor 2B may be moved over the surfaces of a rectangular parallelepiped 30 around the object-to-be-measured 1, and then rotated 90 degrees about Z-axis vertical to the plane and moved within the same plane. Due to this, the electric vectors on a scanning plane and distribution thereof can be calculated from the operation principle of the embodiment, similarly to the second embodiment.

In this manner, the above structure and operation can provide an operation and effect similar to that of the second embodiment, by means of one scanning electromagnetic-field sensor 2B.

The apparatus may be configured by combining the structures or operations of the embodiments or by replacing a part of structural part.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A method of measuring an electric-field vector formed by an electromagnetic radiation source, the method comprising:
   detecting a reference signal comprising at least one of electric-field and magnetic-field component currents by fixedly placing a first probe near the radiation source;
   detecting a first signal comprising at least an electric-field component current at a first location, by moving a second probe to the first location near the radiation source;
   detecting a second signal comprising at least an electric-field component current at a second location by moving the second probe to the second location;
   calculating a potential difference between the first and second signals based on at least in part the first signal, the second signal, and the reference signal;
   calculating a distance between the first and second locations; and
   calculating an electric-field vector at the first location based on at least in part the potential difference and the distance.

2. The method of claim 1, further comprising calculating a distribution of electric-field vectors at multiple locations by sequentially moving the second probe to each location.

3. The method of claim 1, further comprising;
   detecting a third signal comprising at least a magnetic-field component current at a third location by moving a third probe to the third location; and
   calculating a magnetic-field vector at the third location based on at least in part the third signal and the reference signal.

4. The method of claim 1, further comprising
   detecting a third signal comprising at least a magnetic-field component current at a first location when the second probe is moved to the first location; and
   calculating a magnetic-field vector at the first location based on at least in part the third signal and the reference signal.

5. The method of claim 2, further comprising calculating an electromagnetic-field intensity at a particular location distant from the radiation source based at least in part on the electric-field vector distribution.

6. The method of claim 3, further comprising:
   calculating a distribution of electric-field vectors at multiple locations by sequentially moving the second probe to each location;
   calculating a distribution of magnetic-field vectors at multiple locations by sequentially moving the third probe to each location; and
   calculating an electromagnetic-field intensity at a particular location distant from the radiation source based at least in part on the electric-field vector distribution and the magnetic-field vector distribution.

7. The method of claim 4, further comprising:
   calculating a distribution of electric-field vectors and distribution of magnetic-field vectors at multiple locations by sequentially moving the second probe to each location; and
   calculating an electromagnetic-field intensity at a particular location distant from the radiation source based at least in part on the distribution of electric-field vectors and distribution of magnetic-field vectors.

8. An apparatus configured to measure an electromagnetic field formed by an electromagnetic radiation source, the apparatus comprising:
   a first probe fixedly located near the radiation source for detecting a reference signal comprising at least one of electric-field and magnetic-field component currents;
   a second probe near configured to be movable for detecting a signal comprising an electric-field component current at the location that the second probe moves to;
   a computation unit configured to calculate the electric-field vector of the electromagnetic field based on signals generated by the first and the second probes; and
   a control section configured to move the second probe to scan over the radiation source.

9. The apparatus of claim 8, further comprising a third probe configured to be movable for detecting a signal comprising a magnetic-field component current at the location that the third probe moves to, wherein the computation unit is also configured to calculate a magnetic-field vector of the electromagnetic field based at least in part on signals generated by the first and the third probes.

10. The apparatus of claim 8, wherein the second probe is further configured to detect a signal comprising a magnetic-field component current at the location of the second probe, and the computation unit is further configured to calculate a magnetic-field vector based at least in part on signals generated by the first and the second probes.

11. The apparatus of claim 8, wherein the computation unit is further configured to calculate an electromagnetic-field intensity at a particular location distant from the radiation source, based at least in part on the electric-field vector at multiple locations.

12. The apparatus of claim 9, wherein the computation unit is further configured to calculate a distribution of electric-field vectors and magnetic-field vectors at multiple locations and an electromagnetic-field intensity at a particular location distant from the radiation source based at least in part on signals generated from the first second, and third probes.

13. The apparatus of claim 10, wherein the computation unit is further configured to calculate a distribution of electric-field vectors and magnetic-field vectors at multiple locations and an electromagnetic-field intensity at a particular location distant from the radiation source based at least in part on signals generated from the first and second probes.

14. A computer readable medium storing executable instructions for causing a general purpose computer to perform the calculating steps of claim 1.

15. A computer readable medium storing executable instructions for causing a general purpose computer to perform the calculating steps of claim 3.

16. A computer readable medium storing executable instructions for causing a general purpose computer to perform the calculating steps of claim 4.

17. A computer readable medium storing executable instructions for causing a general purpose computer to perform the calculating steps of claim 5.

18. A computer readable medium storing executable instructions for causing a general purpose computer to perform the calculating steps of claim 6.

19. A computer readable medium storing executable instructions for causing a general purpose computer to perform the calculating steps of claim 7.

* * * * *

UNITED STATES PATENT AND TRADEMARK OFFICE
CERTIFICATE OF CORRECTION

PATENT NO. : 7,358,749 B2
APPLICATION NO. : 11/336494
DATED : April 15, 2008
INVENTOR(S) : Satoshi Kazama, Masahiko Sakurada and Hiroshi Tsutagaya It is certified that error appears in the above-identified patent and that said Letters Patent is hereby corrected as shown below:

At Column 9, Line 24, please delete "n=.." and insert therefore,
--n=...j-3, j-2, j-1, j, j+1...) on--.

At Column 9, Line 44, please delete "$Y_{i+1}$)." and insert therefore --$Y_{j+1}$).--.

At Column 13, Line 67, please delete "(7)" and insert therefore, --(8)--.

At Column 16, Line 39, please delete "first" and insert therefore, --first,--.

Signed and Sealed this

Twenty-ninth Day of December, 2009

David J. Kappos
*Director of the United States Patent and Trademark Office*